(12) United States Patent
Wang et al.

(10) Patent No.: US 7,302,655 B2
(45) Date of Patent: Nov. 27, 2007

(54) METHOD FOR VERIFYING A CIRCUIT DESIGN BY ASSIGNING NUMERICAL VALUES TO INPUTS OF THE CIRCUIT DESIGN

(75) Inventors: Chun-Yao Wang, Hsinchu (TW); Jan-An Hsieh, Hsinchu (TW); Shih-Chieh Wu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 277 days.

(21) Appl. No.: 11/152,472

(22) Filed: Jun. 14, 2005

(65) Prior Publication Data

US 2006/0282805 A1    Dec. 14, 2006

(51) Int. Cl.
*G06F 17/50* (2006.01)
(52) U.S. Cl. .............................................. 716/5; 716/4
(58) Field of Classification Search .................... 716/1, 716/4, 5
See application file for complete search history.

(56) References Cited

U.S. PATENT DOCUMENTS 6,212,669 B1 * 4/2001 Jain ............................... 716/7

OTHER PUBLICATIONS

Ilker Hamzaoglu and Janak H. Patel, "New Techniques for Deterministic Test Pattern Generation", Journal of Electronic Testing: Theory and Applications, Aug.-Oct. 1999, pp. 63-73, vol. 15, Issue 1-2, Kluwer Academic Publishers Norwell, MA, USA.

Vishwani D. Agrawal and David Lee, "Characterisic Polynomial Method for Verification and Test of Combinational Circuits", 9th International Conference on VLSI Design, Sep. 1996 vol. 00, p. 341, IEEE, Washington D.C.

Jawahar Jain et. al., "Probabilistic Design Verification", Proc. Intl Conf. Computer-Aided Design, 1991, pp. 468-471.

Sarangan Krishna Kumar and Melvin A. Breuer, "Probabalistic Aspects of Boolean Switching Functions via a New Transform", Journal of the Association for computing Machinery, Jul. 1981, pp. 502-520, vol. 28, No. 3, Association for Computing Machinery, New York NY.

* cited by examiner

*Primary Examiner*—Thuan Do
(74) *Attorney, Agent, or Firm*—Egbert Law Offices (57) ABSTRACT

A method for verifying a circuit design includes a step of assigning numerical values $1/a_i$ to input ports of the circuit design according to a function $a_{i+1}=(a_i-1)^2+1$, wherein i represents the number of the input port and the numerical value $a_1$ is not equal to 2 or 1. Preferably, $a_1$ is equal to or larger than 3, and is a positive integer. Particularly, the numerical value represents 1's probability. In addition, the present method further includes a step of calculating an output value at an output port of the circuit design based on the numerical values assigned to the input port, and calculating the output value is performed from the input port to the output port at a Boolean gate level.

9 Claims, 13 Drawing Sheets

| $X_3 X_2 X_1$ | $x_3$ | $x_2$ | $x_1$ | prob. of minterm |
|:---:|:---:|:---:|:---:|:---:|
| 0 0 0 | $(1-\frac{1}{82})$ | $(1-\frac{1}{10})$ | $(1-\frac{1}{4})$ | $\frac{2187}{3280}$ |
| 0 0 1 | $(1-\frac{1}{82})$ | $(1-\frac{1}{10})$ | $\frac{1}{4}$ | $\frac{720}{3280}$ |
| 0 1 0 | $(1-\frac{1}{82})$ | $\frac{1}{10}$ | $(1-\frac{1}{4})$ | $\frac{243}{3280}$ |
| 0 1 1 | $(1-\frac{1}{82})$ | $\frac{1}{10}$ | $\frac{1}{4}$ | $\frac{81}{3280}$ |
| 1 0 0 | $\frac{1}{82}$ | $(1-\frac{1}{10})$ | $(1-\frac{1}{4})$ | $\frac{27}{3280}$ |
| 1 0 1 | $\frac{1}{82}$ | $(1-\frac{1}{10})$ | $\frac{1}{4}$ | $\frac{9}{3280}$ |
| 1 1 0 | $\frac{1}{82}$ | $\frac{1}{10}$ | $(1-\frac{1}{4})$ | $\frac{3}{3280}$ |
| 1 1 1 | $\frac{1}{82}$ | $\frac{1}{10}$ | $\frac{1}{4}$ | $\frac{1}{3280}$ |

| $X_3 X_2 X_1$ | $x_3$ | $x_2$ | $x_1$ | prob. of minterm |
|---|---|---|---|---|
| 0 0 0 | $(1-\frac{1}{17})$ | $(1-\frac{1}{5})$ | $(1-\frac{1}{3})$ | $\frac{128}{255}$ |
| 0 0 1 | $(1-\frac{1}{17})$ | $(1-\frac{1}{5})$ | $\frac{1}{3}$ | $\frac{64}{255}$ |
| 0 1 0 | $(1-\frac{1}{17})$ | $\frac{1}{5}$ | $(1-\frac{1}{3})$ | $\frac{32}{255}$ |
| 0 1 1 | $(1-\frac{1}{17})$ | $\frac{1}{5}$ | $\frac{1}{3}$ | $\frac{16}{255}$ |
| 1 0 0 | $\frac{1}{17}$ | $(1-\frac{1}{5})$ | $(1-\frac{1}{3})$ | $\frac{8}{255}$ |
| 1 0 1 | $\frac{1}{17}$ | $(1-\frac{1}{5})$ | $\frac{1}{3}$ | $\frac{4}{255}$ |
| 1 1 0 | $\frac{1}{17}$ | $\frac{1}{5}$ | $(1-\frac{1}{3})$ | $\frac{2}{255}$ |
| 1 1 1 | $\frac{1}{17}$ | $\frac{1}{5}$ | $\frac{1}{3}$ | $\frac{1}{255}$ |

FIG. 4

| $x_i$ | ... | ... | $x_2$ | $x_1$ | prob. of minterm |
|---|---|---|---|---|---|
| $(1-\frac{1}{a_i})$ | ... | ... | ... | $(1-\frac{1}{3})$ | $\frac{2^{2^{i-1}}}{\prod_{t=1}^{i} a_t}$ |
| ⋮ | ⋮ | ⋮ | ⋮ | ⋮ | ⋮ |
| ⋮ | ⋮ | ⋮ | ⋮ | $(1-\frac{1}{3})$ | |
| $(1-\frac{1}{a_i})$ | ... | ... | ... | $\frac{1}{3}$ | $\frac{2^{2^{i-1}}}{\prod_{t=1}^{i} a_t}$ |
| $\frac{1}{a_i}$ | ... | ... | ... | $(1-\frac{1}{3})$ | $\frac{2^{2^{(i-1)}-1}}{\prod_{t=1}^{i} a_t}$ |
| ⋮ | ⋮ | ⋮ | ⋮ | ⋮ | ⋮ |
| ⋮ | ⋮ | ⋮ | ⋮ | $(1-\frac{1}{3})$ | $\frac{2^1}{\prod_{t=1}^{i} a_t}$ |
| $\frac{1}{a_i}$ | ... | ... | ... | $\frac{1}{3}$ | $\frac{2^0}{\prod_{t=1}^{i} a_t}$ |

FIG. 5(a)

| $x_{i+1}$ | $x_i$ | ... | ... | $x_2$ | $x_1$ | prob. of minterm |
|---|---|---|---|---|---|---|
| $\frac{(a_i-1)}{a_{i+1}}$ | $(1-\frac{1}{a_i})$ | ... | ... | ... | $(1-\frac{1}{3})$ | $2^{2^{(i+1)}-1}$ |
| ⋮ | ⋮ | ⋮ | ⋮ | ⋮ | ⋮ | ⋮ |
| ⋮ | ⋮ | ⋮ | ⋮ | ⋮ | $(1-\frac{1}{3})$ | ⋮ |
| $\frac{(a_i-1)^2}{a_{i+1}}$ | $\frac{1}{a_i}$ | ... | ... | ... | $\frac{1}{3}$ | $\frac{2^{2^i}}{\prod_{t=1}^{i+1} a_t}$ |
| $\frac{1}{a_{i+1}}$ | $(1-\frac{1}{a_i})$ | ... | ... | ... | $(1-\frac{1}{3})$ | $2^{2^i-1}$ |
| ⋮ | ⋮ | ⋮ | ⋮ | ⋮ | ⋮ | ⋮ |
| ⋮ | ⋮ | ⋮ | ⋮ | ⋮ | $(1-\frac{1}{3})$ | $\frac{2^1}{\prod_{t=1}^{i+1} a_t}$ |
| $\frac{1}{a_{i+1}}$ | $\frac{1}{a_i}$ | ... | ... | ... | $\frac{1}{3}$ | $\frac{2^0}{\prod_{t=1}^{i+1} a_t}$ |

FIG. 5(b)

| $X_3 X_2 X_1$ | $x_3$ | $x_2$ | $x_1$ | prob. of minterm |
|---|---|---|---|---|
| 0 0 0 | $(1-\frac{1}{82})$ | $(1-\frac{1}{10})$ | $(1-\frac{1}{4})$ | $\frac{2187}{3280}$ |
| 0 0 1 | $(1-\frac{1}{82})$ | $(1-\frac{1}{10})$ | $\frac{1}{4}$ | $\frac{720}{3280}$ |
| 0 1 0 | $(1-\frac{1}{82})$ | $\frac{1}{10}$ | $(1-\frac{1}{4})$ | $\frac{243}{3280}$ |
| 0 1 1 | $(1-\frac{1}{82})$ | $\frac{1}{10}$ | $\frac{1}{4}$ | $\frac{81}{3280}$ |
| 1 0 0 | $\frac{1}{82}$ | $(1-\frac{1}{10})$ | $(1-\frac{1}{4})$ | $\frac{27}{3280}$ |
| 1 0 1 | $\frac{1}{82}$ | $(1-\frac{1}{10})$ | $\frac{1}{4}$ | $\frac{9}{3280}$ |
| 1 1 0 | $\frac{1}{82}$ | $\frac{1}{10}$ | $(1-\frac{1}{4})$ | $\frac{3}{3280}$ |
| 1 1 1 | $\frac{1}{82}$ | $\frac{1}{10}$ | $\frac{1}{4}$ | $\frac{1}{3280}$ |

METHOD FOR VERIFYING A CIRCUIT DESIGN BY ASSIGNING NUMERICAL VALUES TO INPUTS OF THE CIRCUIT DESIGN

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates to a method for verifying a circuit design by assigning numerical values to inputs of the integrated circuit design, and more particularly, to a method for verifying an integrated circuit design by assigning numerical values according a recursive function to inputs of the circuit design.

BACKGROUND OF THE INVENTION

Verification is a process used to demonstrate the functional correctness of an integrated circuit design. While the growth rate of design complexity is increasing, to verify whether a design is error-free is becoming more difficult. Today, in a design team properly staffed to address the verification challenge, the number of verification engineers usually doubles the number of designers. After the design projects are finished, the verification usually takes from 60% to 80% of the total development efforts for the design. Thus, design verification plays a crucial role in the modern design flow.

The design verification proceeds in two stages. In the first stage, a Boolean network is extracted from the actual design description. Next, in the second stage, the extracted Boolean network is verified against the specification. Traditionally, logic verification is carried out by pattern simulation. However, to exhaustively simulate all possible patterns is impractical for designs with large numbers of inputs. Thus, formal logic verification methods are becoming popular. It is possible to guarantee the correctness of a design by using these formal methods.

Existing approaches to formally verify the equivalence of two Boolean networks can be classified into two categories: (1) structural, and (2) functional. The structural methods identify some internal nodes of two Boolean networks and use them to construct a miter structure. It examines if the output of the miter stuck-at-0 fault is untestable by Automatic Test Pattern Generation (ATPG) (See: I. Hamzaoglu and J. H. Patel, "New Techniques for Deterministic Test Pattern Generation," in Proc. of VLSI Test Symposium, pp. 446-452, 1998.). If the fault is untestable, there does not exist a pattern to distinguish the two logic cones and, hence, these internal nodes are equivalent. Then one internal node can be replaced by the other internal node and the network is simplified. The capability of this approach relies on the efficiency of ATPG. However, the approach becomes inefficient if the fault test at the miter output is time-consuming or intractable.

On the other hand, the functional methods use canonic representations to represent the Boolean networks. Two Boolean networks are equivalent if and only if the representations are equal. Reduced Ordered Binary Decision Diagram (ROBDD) is a canonic representation of Boolean networks. Although one can use ROBDD to verify the equivalence of two Boolean networks directly, the ROBDD construction often results in memory explosion problems and is a time-consuming process. Furthermore, the size of ROBDD is sensitive to the variable ordering.

To verify the equivalence of two Boolean networks is not easy. However, to assert that two Boolean networks are nonequivalent is generally much easier. Signature-based approaches are proposed to efficiently justify the nonequivalence of two Boolean networks. The signature-based approaches apply signature functions on Boolean networks/equations to characterize circuits' inputs or outputs. For example, the number of minterms in a Boolean network is a basic signature function to characterize circuits' outputs. If the signature values of two Boolean networks are different, the two Boolean networks are not equivalent. Otherwise, however, they are only possibly equivalent. Where two different Boolean networks have the same signature value, this is known as aliasing. A good signature function should be both descriptive and easy to calculate. However, both objectives are not easy to simultaneously achieve. Various signature functions are proposed to effectively reduce the aliasing rate. Nevertheless, signature based approaches still only act as a preprocessor to justify the nonequivalence of two Boolean networks.

Signal probability of a Boolean network has applications to power estimation and testability analysis. But only approximate values are needed for these two applications. On the other hand, although output probability of a Boolean network is considered as a signature function for logic verification (See: V. D. Agrawal and D. Lee, "Characteristic Polynomial Method for Verification and Test of Combinational Circuits," in Proc. of Int. Conf. on VLSI Design, pp. 341-342, 1996. & J. Jain, J. Bitner, D. S. Fussell, and J. A. Abraham, "Probabilistic Design Verification," in Proc. of Int. Conf. On Computer-Aided Design, pp. 468-471, 1991.), the correct output probability is a must under input probability assignments. When the output probabilities are not equal under the same set of input probability, the two Boolean networks are not equivalent. But the inverse is not true. That is, aliasing could occur. Although the aliasing rate of this approach would be reduced with multiple runs of input probability assignments, the equality of two output probabilities still does not guarantee the equivalence of two Boolean networks. It is obvious that the occurrence of aliasing relies on the input probability assignments.

Figure 1:
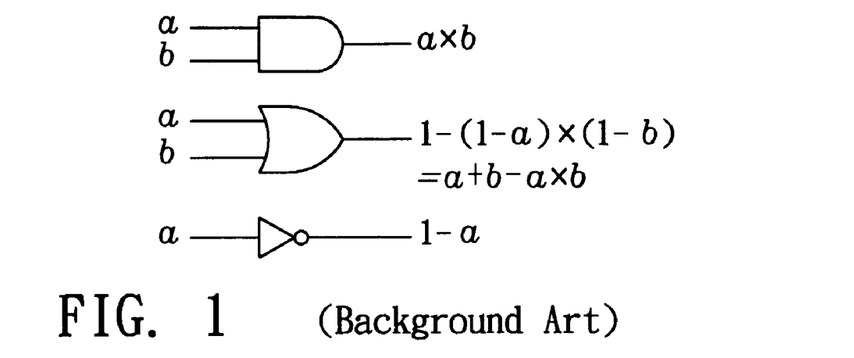
FIG. 1 is a schematic diagram showing the probability formulae for primitive gates.

Assuming that the Boolean network consists only of AND, OR, and NOT gates for simplicity. Complex gates can be decomposed into these gates. An upper case letter denotes a node in the Boolean network and the corresponding lower case letter denotes its 1's probability. The known probability formulae for 2-input AND, OR, and NOT gates with independent inputs are summarized in FIG. 1. The formulae for AND, OR gates with more than 2 inputs can be extended from these 2-input gates.

Figure 2:
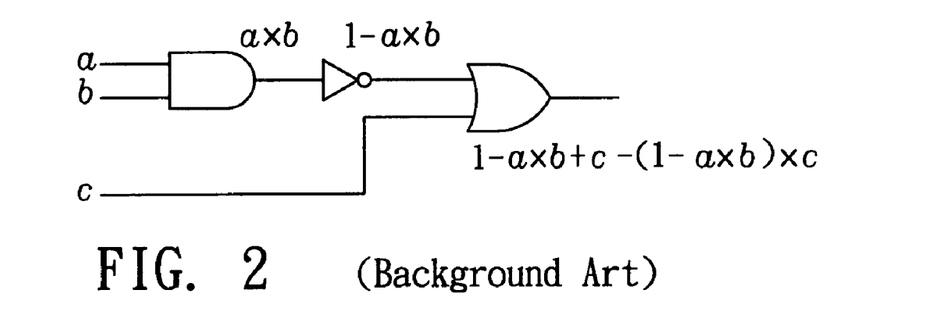
FIG. 2 is a schematic diagram showing the probability derivation of a tree structure network.
Figure 3:
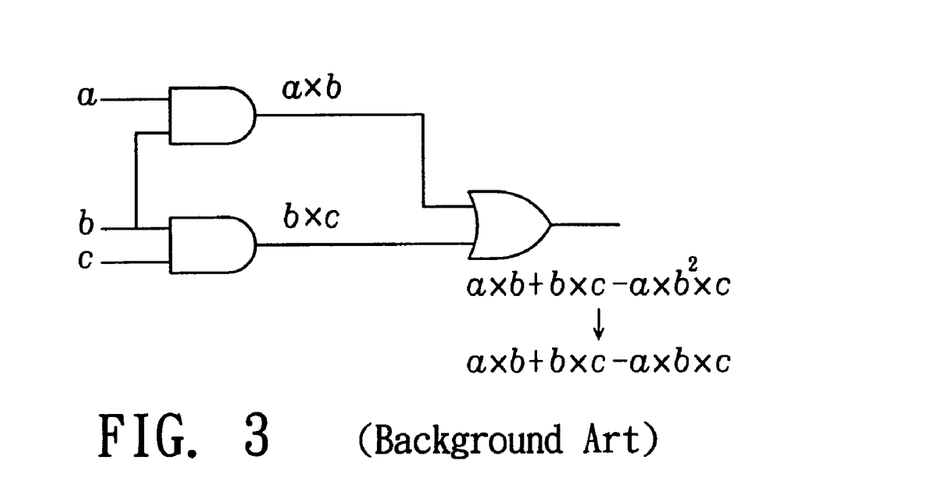
FIG. 3 is a schematic diagram showing the probability derivation with exponent suppression.

The probability expression of a Boolean network can be derived from primary inputs to primary outputs by using these probability formulae. However, this expression is correct only if the Boolean network is a tree structure, as shown in FIG. 2. Its probability expression can be easily obtained. If the Boolean network contains reconvergent gates, the corresponding probability expression cannot be correctly derived as that of a tree structure network. This is because the input signals of reconvergent gates are correlated rather than independent. Thus, the process of deriving probability expression has to be modified. The modification is named exponent suppression, which replaces the term $x^m$ with x for every node X in the original probability expression. This is because a node X is fully correlated with itself; the probability $x^m$ has to be modified as x. After the exponent suppression, the modified probability expression is correct. For example as shown in FIG. 3, the probability expression at output is originally $axb+bxc-axb^2xc$. After the exponent suppression modification, the probability expression becomes $axb+bxc-axb^2xc$ ($b^2$ is replaced by b). It is proven that the probability expression with the exponent suppression modification is unique for a Boolean network (See: J. Jain, J. Bitner, D. S. Fussell, and J. A. Abraham, "Probabilistic Design Verification," in Proc. of Int. Conf. On Computer-Aided Design, pp. 468-471, 1991.). Namely, if two Boolean networks (regardless of having reconvergent gates or not) have the same probability expression after the exponent suppression modification, they are equivalent; otherwise, they are nonequivalent. Thus, the probability expression is a canonic representation.

Although probability expression is a canonic representation, deriving it for the logic verification of large circuit is intractable. This is because $O(n \times 2^n)$ operations are required for an n-input Boolean network. Also, the number of product terms in the probability expression is in the worst case. For example, the number of possible product terms in a 3-input Boolean network is $2^3=8$ and they are [1, $x_3$, $x_2$, $x_2$, $x_3$, $x_1$, $x_1$, $x_3$, $x_1$, $x_2$, $x_1$, $x_2$, $x_3$ ].

BRIEF SUMMARY OF THE INVENTION

The objective of the present invention is to provide a method for verifying an integrated circuit design by assigning numerical values according a recursive function to inputs of the circuit design, which can eliminate the aliasing problem.

In order to achieve the above-mentioned objective and avoid the problems of the prior art, a method is provided for verifying an integrated circuit design. The method for verifying a circuit design comprises a step of assigning numerical values $1/a_i$ to input ports of the circuit design according to a function $a_{i+1}=(a_i-1)^2+1$, wherein i represents the number of the input port and the numerical value $a_1$ is not equal to 2 or 1. Preferably, $a_1$ is a positive integer equal to or larger than 3. Particularly, the numerical value represents 1's probability or 0's probability. In addition, the present method further comprises a step of calculating an output value at an output port of the circuit design based on the numerical values assigned to the input port, and calculation of the output value is performed from the input port to the output port at a Boolean gate level.

The present invention provides a probability assignment procedure to the input port of a Boolean network design so that a unique output probability of the Boolean network design is obtained. In addition, a re-assignment technique is also proposed to reduce the representation complexity.

BRIEF DESCRIPTION OF THE SEVERAL VIEWS OF THE DRAWINGS

The objectives and advantages of the present invention will become apparent upon reading the following description and upon reference to the accompanying drawings.

DETAILED DESCRIPTION OF THE INVENTION

Figure 4:
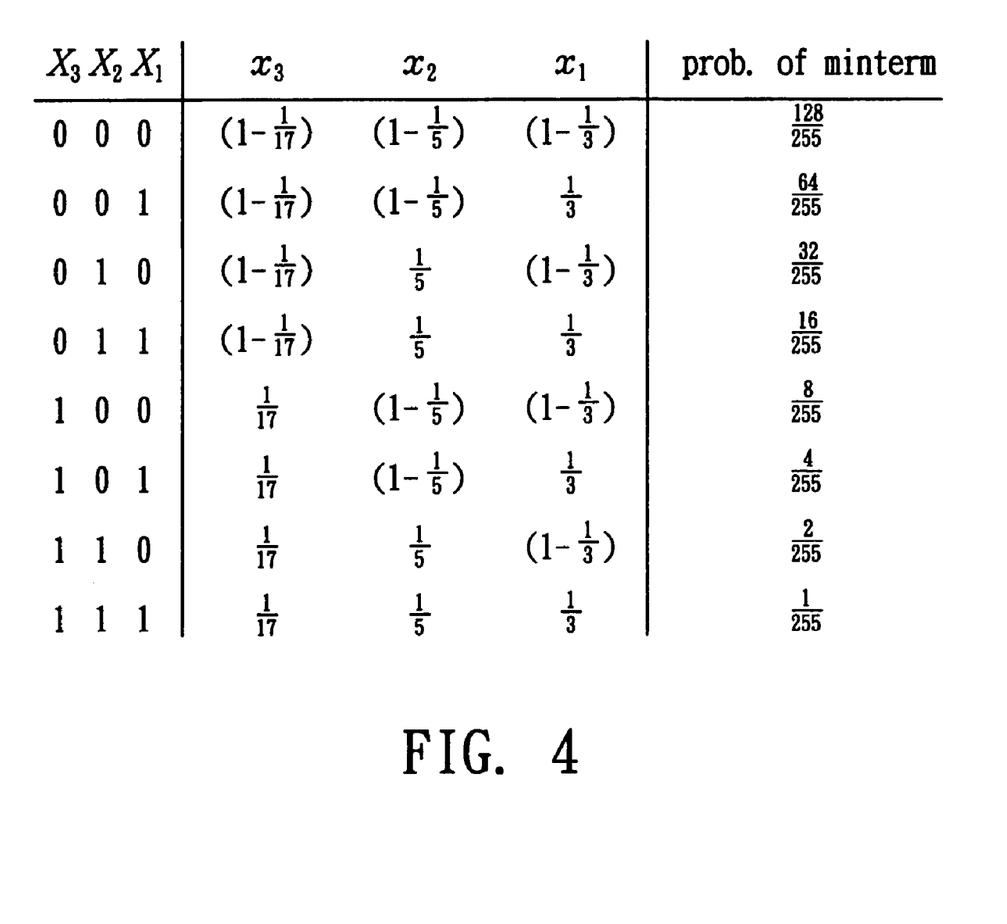
FIG. 4 is a truth table showing the probability of each minterm for 3-input function according to one embodiment of the present invention.

To ensure the equivalence of two Boolean networks after probabilities assignment, the aliasing-free probabilities assignments are crucial. Random probabilities assignments cannot guarantee uniqueness. Given an n-input Boolean network, the number of distinct functions is $2^{2^n}$. This means that the output probabilities values of these functions have to be different as well under the same set of input probabilities. To better describe the procedure of input probability assignment and explain why it results in uniqueness, FIG. 4 shows a logic function with its truth table. Note that using this representation will not affect the correctness of the procedure. Assuming 1's probability of an input variable $X_i$ is $x_i$, then the corresponding 0's probability of $X_i$ is $(1-x_i)$. Thus, for a minterm $X_n \cdot X_{n-1} \ldots X_t \cdot X'_{t-1} \ldots X'_1$ in an n-input function, its probability is $x_n x_{n-1} \times \ldots \times x_t \times (1-x_{t-1}) \times \ldots \times (1-x_1)$. The probability of a function is the summation of the probability of its minterms. If each minterm in the truth table has a unique probability value after the probability assignment, a unique probability value for each function is possible.

For an n-bit positive binary numeral system, the weight of the $i^{th}$ bit is $2^{i-1}$, i=1(LSB)~n(MSB), and the binary numeral system can represent the numbers in the range of $0 \sim (2^n-1)$. Each number has a unique binary representation. Inspired by the encoding of the binary numeral system, the probability value of each minterm also acts as the weight of output probability of a function. If the assigned weight of each minterm is similar to that of binary numeral system, the output probability of each function is unique. Thus, aliasing will not occur. Equation (1) is a recursive function for probability assignments in an n-input Boolean network, which leads to aliasing-free output probabilities. The 1's probability of input variable $X_i$ is $x_i$ and it is assigned as $1/a_i$, where $$a_{i+1}=(a_i-1)^2+1=a_i^2-2a_i+2;$$

$$i=1 \sim n-1;$$

$$a_1 \leq 3 \& a_1 \in Z^+ \quad (1)$$

For example, for a 3-input function, there are $2^{2^3}=256$ distinct functions in total. Setting $a_1=3$, $x_1=\frac{1}{3}$; $a_2=5$, $x_2=\frac{1}{5}$; and $a_3=17$, $x_3=\frac{1}{17}$ according to Equation (1), and the probability of each minterm is shown in FIG. 4. It is obvious that the probability of each minterm can act as weight, which is similar to the weight of binary numeral system. The probability of each function is the summation of subset of these weights. Thus, the probability is unique for each function and is distributed from 0/255~255/255 uniformly.

The uniqueness of output probability obtained by Equation (1) for $a_1=3$ is stated in Theorem 1.

Theorem 1: The probability assignment in an n-input function by Equation (1) for $a_1=3$ results in unique output probability.

Figure 5A:
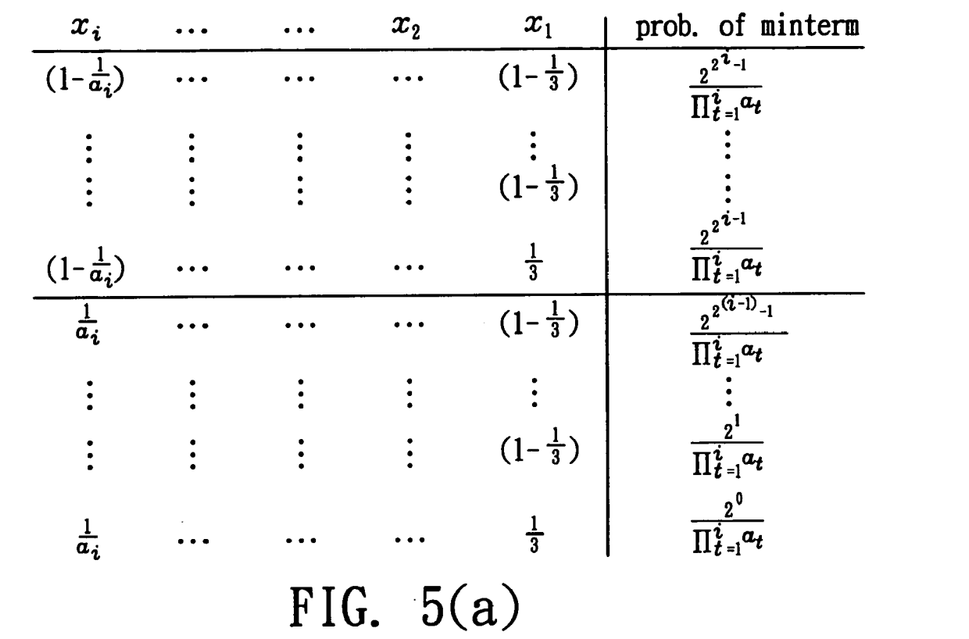
FIG. 5(a) and FIG. 5(b) are truth tables for proving the theorem according to the present invention.

Proof: The number of minterms for an n-input function is $2^n$. If the numerators of the probabilities of these minterms range from $2^0, 2^1, 2^2, \sim 2^{2n-1}$, the output probability of each function is unique. By induction, in the basic step n=1, $a_1=3$, the probabilities of minterms are ⅓ and ⅔, thus, Equation (1) is true. In the induction step, assume Equation (1) for n=i is true, i.e., the numerators of the probabilities of minterms range from $2^0, 2^1, 2^2, \sim 2^{2^i-1}$ as shown in FIG. 5(a). For n=i+1, $$a_{i+1}=(a_i-1)^2+1;$$

$$x_{i+1}=1/[(a_i-1)^2+1];$$

$$1-x_{i-1}=(a_i-1)^2/[(a_i-1)^2+1]=(a_i-1)^2/a_{i+1}$$

For the minterms with uncomplemented $X_{i+1}$, the numerators of the probabilities still range from $2^0, 2^1, 2^2, \sim 2^{2^i-1}$. For the minterms with complemented $X'_{i+1}$, the numerators of the probabilities range from $(2^0, 2^1, 2^2, \sim 2^{2^i-1}) \times (a_i-1)^2$, and $$\begin{aligned}(a_i-1)^2 &= ((a_{i-1}-1)^2+1-1) \\ &= (a_{i-2}-1)^{2^3} \\ &= ((a_{i-2}-1)^2+1-1)^{2^2} \\ &= (a_{i-1}-1)^{2^2} \\ &= \ldots \\ &= ((a_{i-(i-1)}-1)^2+1-1)^{2^{(i-1)+1}} \\ &= (a_1-1)^{2^i} \\ &= (3-1)^{2^i} \\ &= 2^{2^i}\end{aligned}$$

Figure 5B:
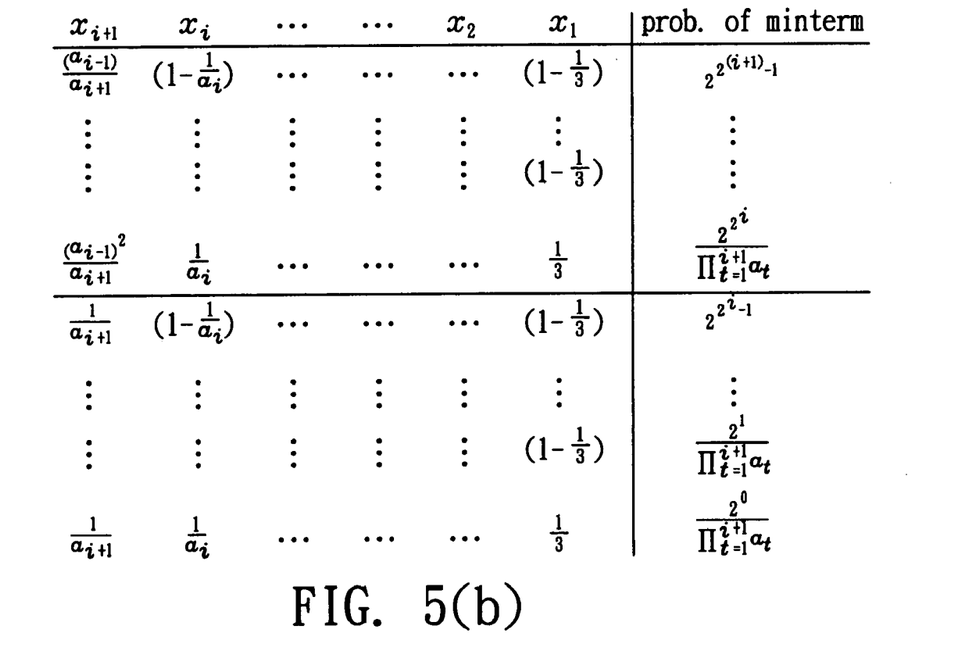

Thus, the numerators of the probabilities range from $2^{2^i}, 2^{2^i+1}, 2^{2^i+2}, \sim 2^{2^{i+1}-1}$ for the minterms with complemented $X'_{i+1}$. Putting together the probabilities of uncomplemented and complemented minterms, they range from $2^0, 2^1, 2^2, \sim 2^{2^{i+1}-1}$, as shown in FIG. 5(b).

Figure 6:
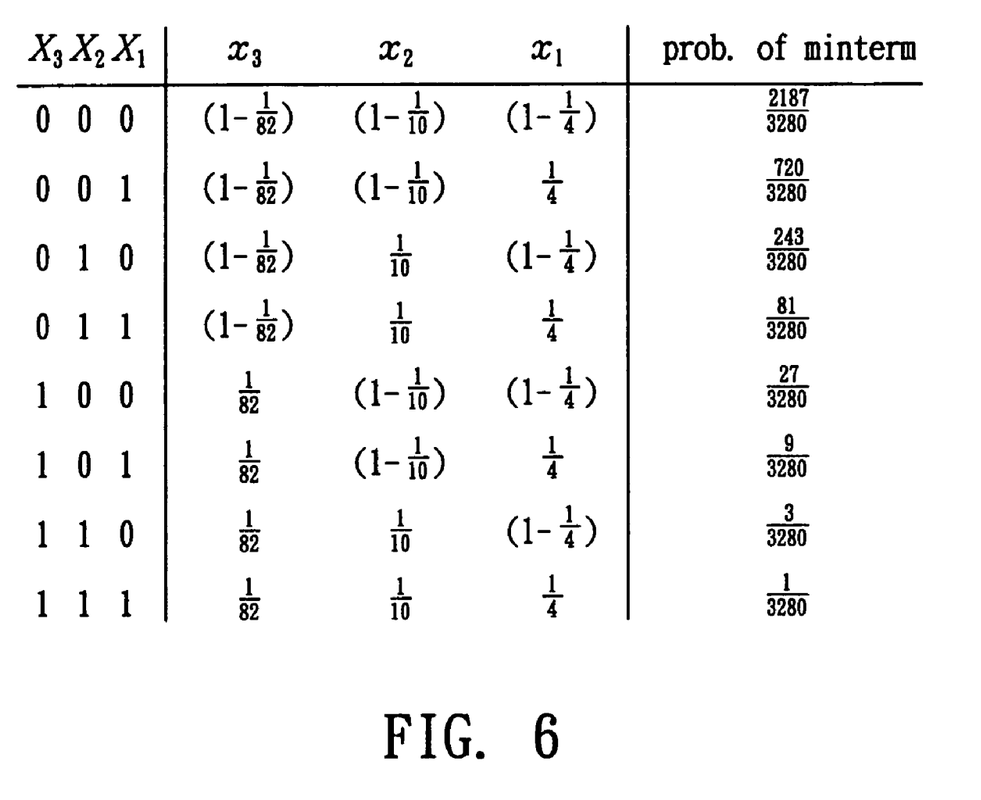
FIG. 6 is a truth table showing the probability of each minterm for 3-input function according to another embodiment of the present invention.

Equation (1) works well for $a_1>3 \& a_1 \in Z^+$ as well. FIG. 6 shows the probability values for $a_1=4$. The probability of each minterm is similar to the ternary numeral system, and the output probability value is unique as well for each function. But this assignment causes some output probabilities not to occur. Note that $a_1=2$ is an infeasible assignment. This is because the 1's probability of $X_1$ equals its 0's probability, $x_1=½=(1-x_1)$. It will cause the probabilities of two minterms to be equal. To minimize the memory usage in representing the probabilities of internal nodes or output nodes, the assignment of $a_1=3$ is preferable.

Figure 7A:
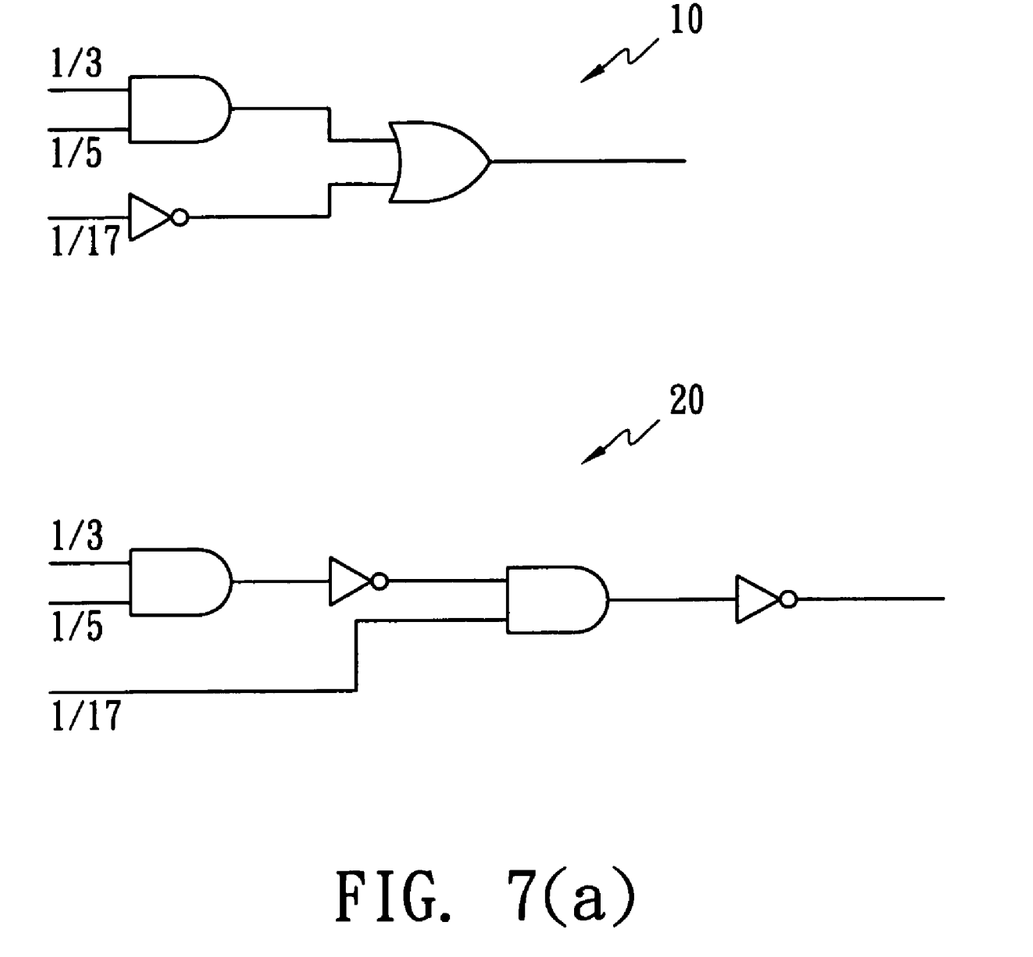
FIG. 7(a) to FIG. 7(e) are schematic views illustrating a method for verifying the equivalence of two circuit designs according to one embodiment of the present invention.
Figure 7B:
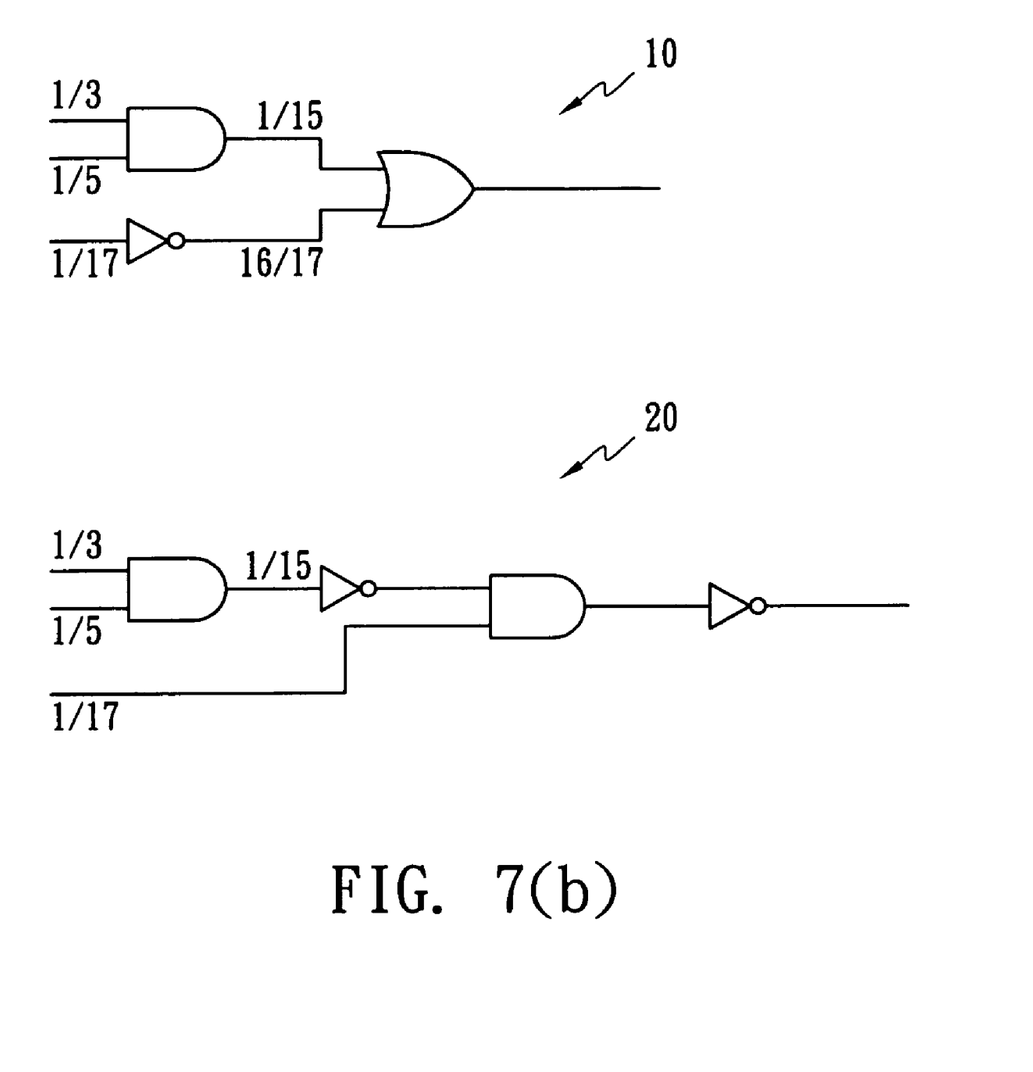
Figure 7C:
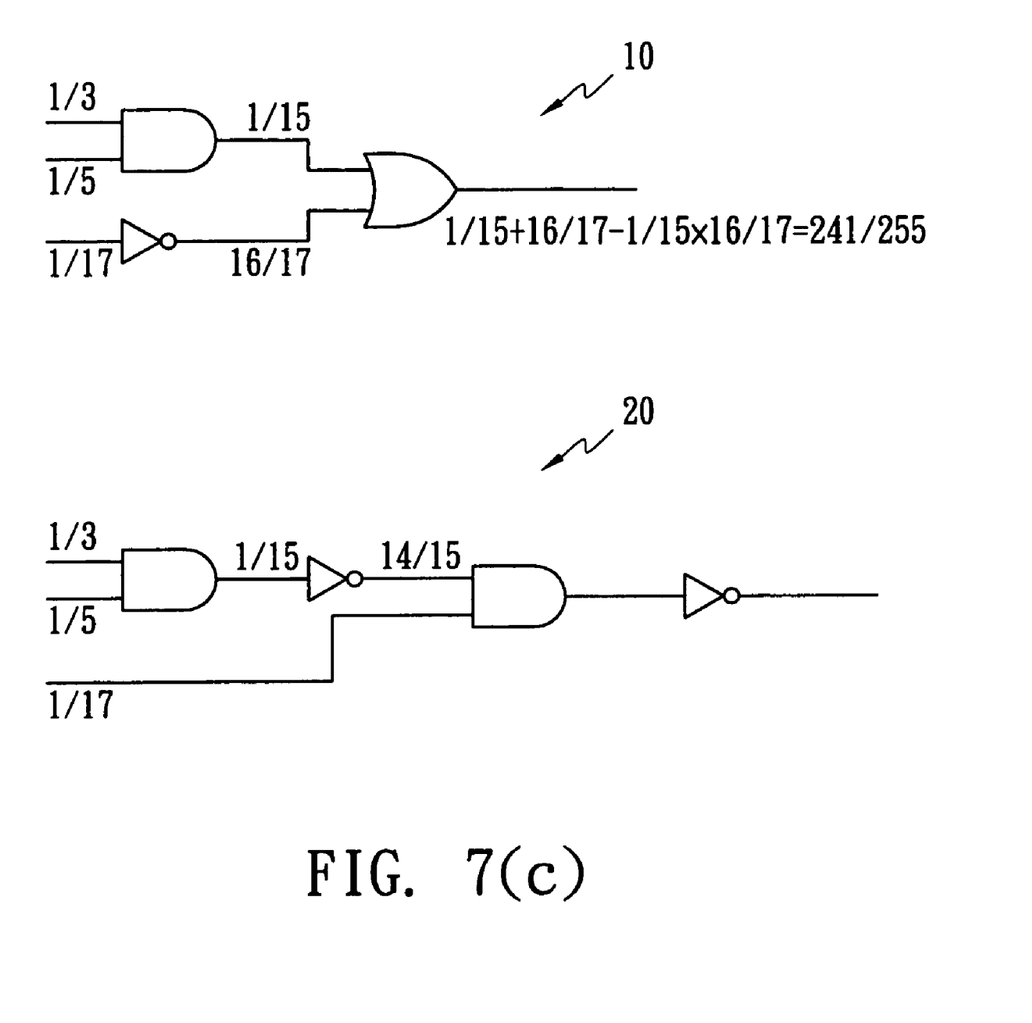
Figure 7D:
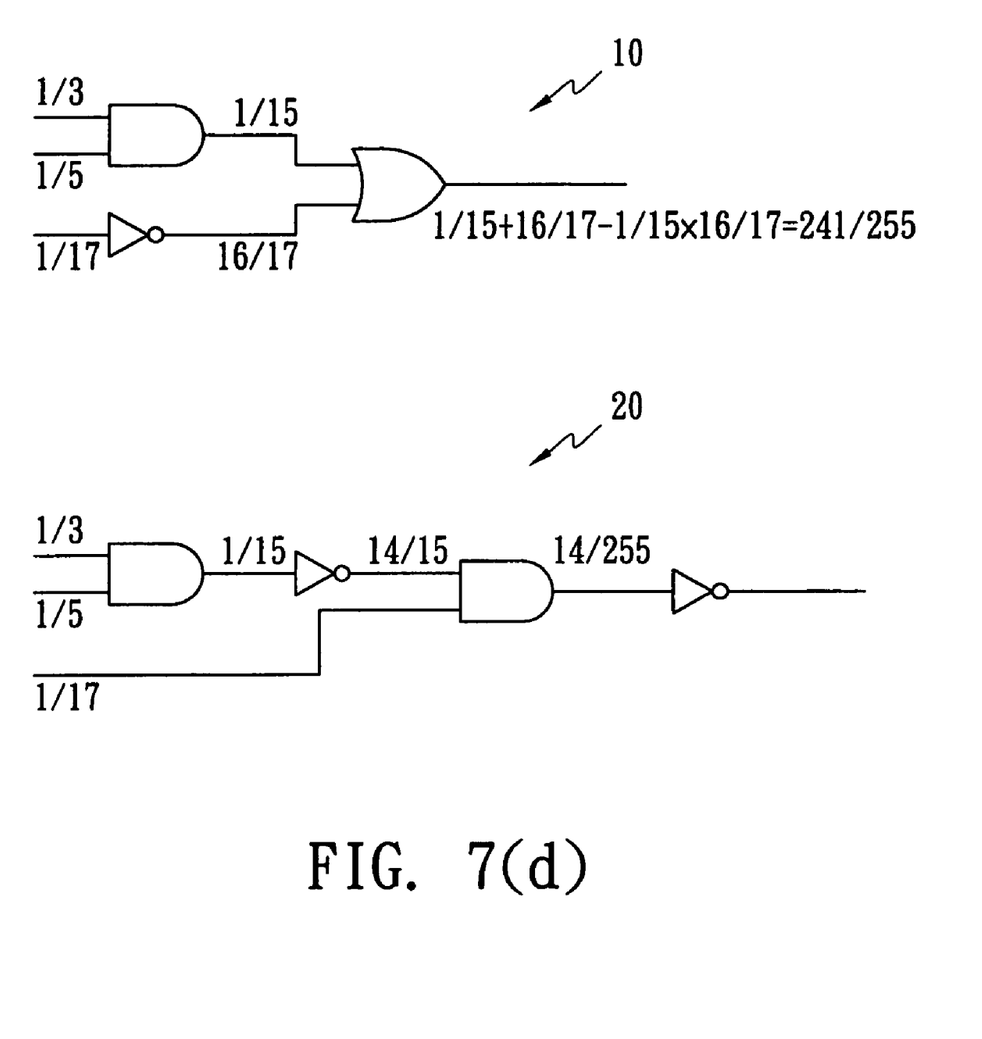
Figure 7E:
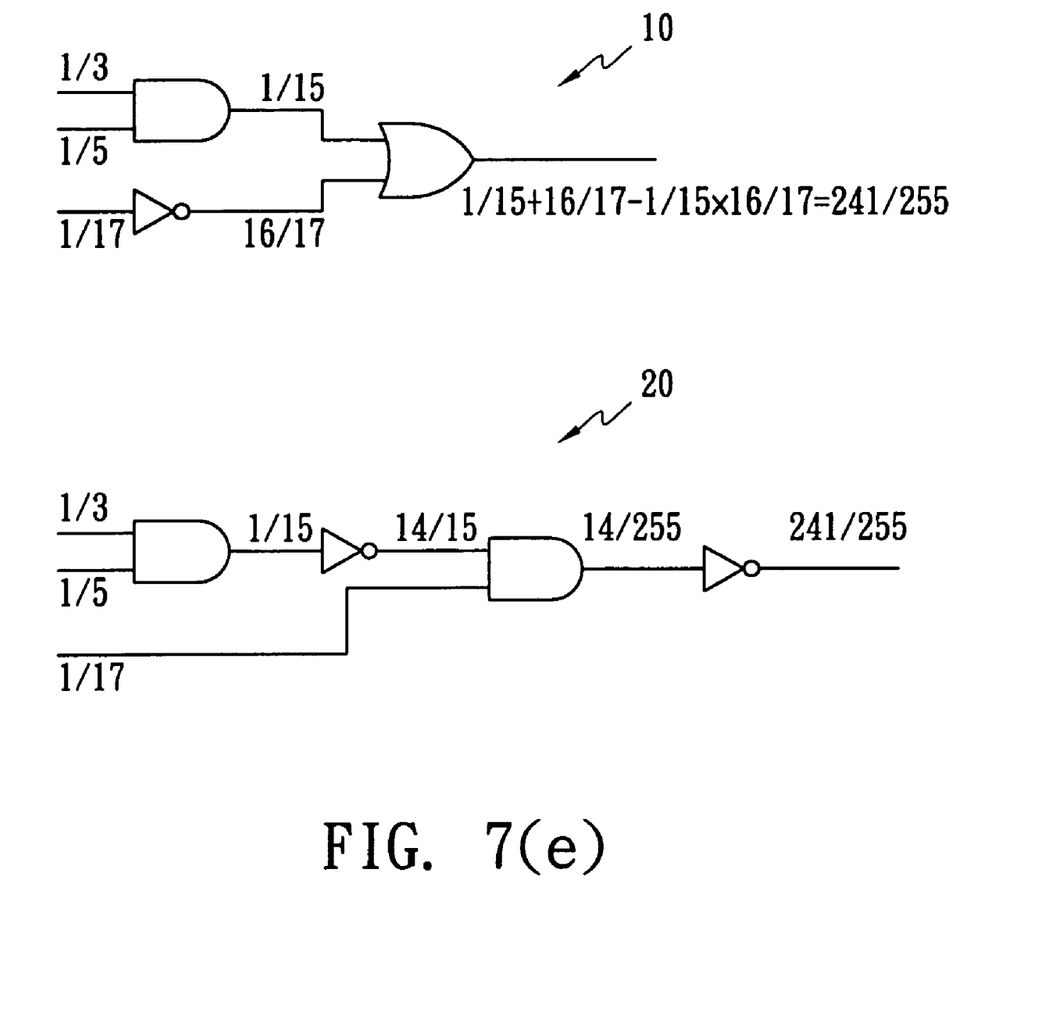

FIG. 7(a) to FIG. 7(e) illustrate a method for verifying the equivalence of two circuit designs 10, 20 according to one embodiment of the present invention. The present method first assigns numerical values such as the 1's probability $1/a_i$ to input ports of the circuit design 10, 20 according to the function $a_{i+1}=(a_i-1)^2+1$, wherein $a_1=3$, $x_1=⅓$; $a_2=5$, $x_2=⅕$; and $a_3=17$, and $x_3=1/17$, as shown in FIG. 7(a). According to the algebraic expression of the AND gate, the NOR gate, and the inverter in FIG. 1 to FIG. 3, an output value (output probability) at each output port of the two circuit designs 10, 20 can be obtained based on the numerical values assigned to the input ports. Particularly, the output value at each output port is calculated from the input port to the output port at a Boolean gate level in a step-by-step manner, i.e., at the AND gate, NOR gate and the inverter level, as shown in FIG. 7(b) to FIG. 7(e). Finally, the output values of the two circuit designs 10, 20 are used to check if the two circuit designs 10,20 are functionally equivalent. Although the structures of the two circuit designs 10, 20 are different, the output values of the two circuit designs 10, 20 are equal to 241/255 and therefore the two circuit designs 10, 20 are functionally equivalent.

The assigned numerical values of the input ports are increasing exponentially according to Equation (1). For example, the 6th input assignment is $1/a6=(½+1)=1/4294967297$. Thus, assigning numerical values to all input ports and then evaluating output value is impractical for a Boolean network with large number of input ports. To solve this representation complexity, the equivalence of internal nodes is used to minimize the number of input ports involved.

Figure 8A:
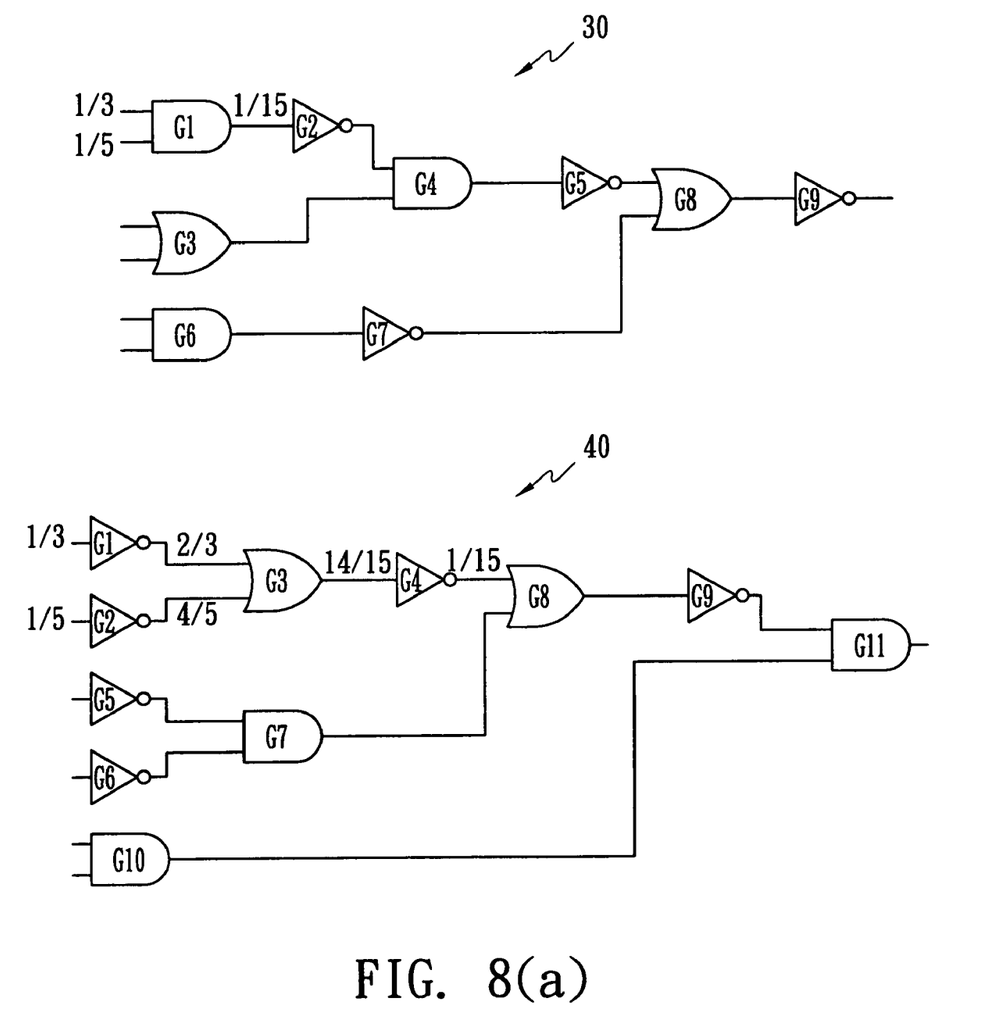
FIG. 8(a) to FIG. 8(d) are schematic views illustrating a method of re-assigning input probability to reduce the representation complexity.
Figure 8B:
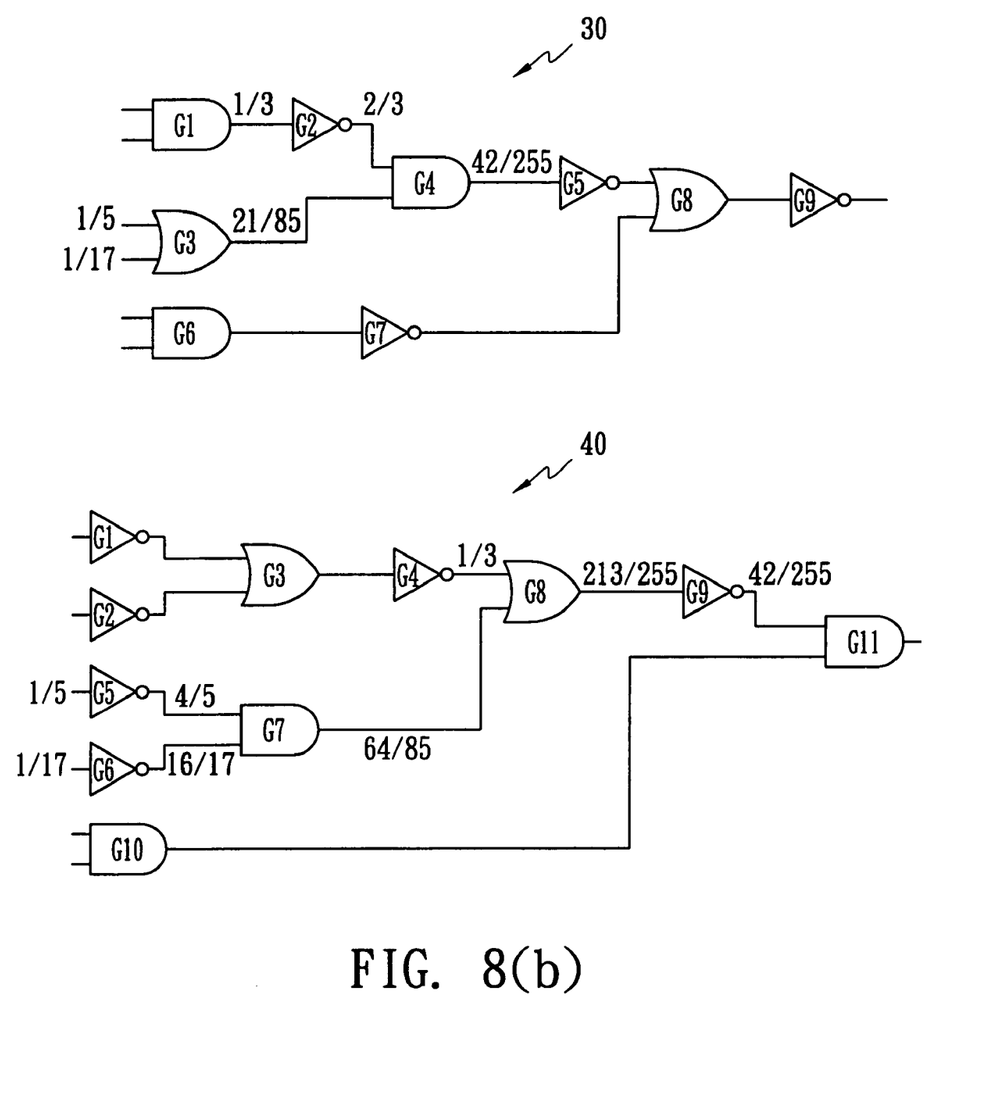
Figure 8C:
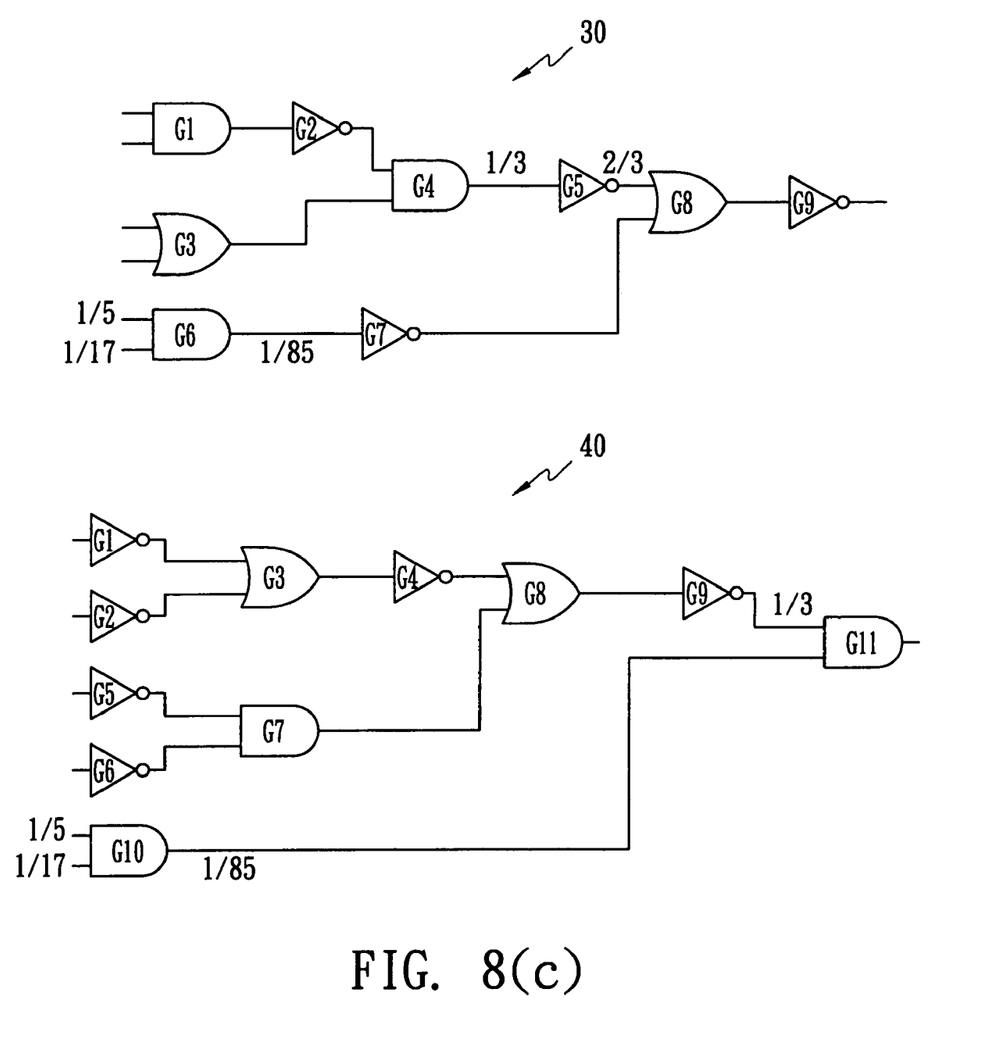
Figure 8D:
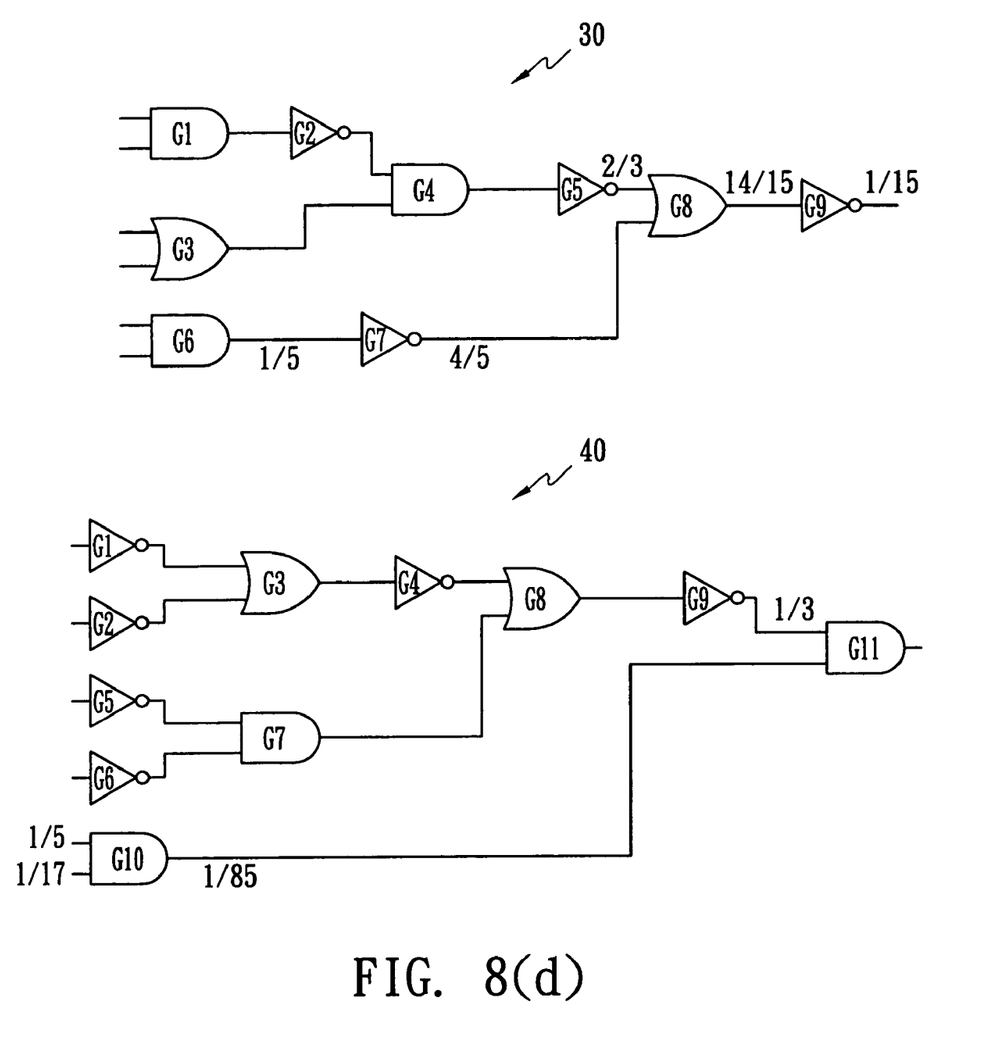

Probabilities derived from Equation (1) are not assigned to all input ports directly, but assigned to some of the input ports. Evaluation is then performed to find an equivalent internal node, whose input probability is re-assigned. The first input probability ⅓ is assigned, and it propagates forward. Next the second input probability ⅕ is assigned, and it propagates as well. When the probabilities of two internal nodes in circuit designs 30 and 40 are equivalent after the propagation, the functionalities of these two nodes are the same. In FIG. 8(a), G1 in circuit design 30 is 1/15, and G4 in circuit design 40 is 1/15. They are equivalent, thus, the probabilities of G1 in circuit design 30 and G4 in circuit design 40 can be re-assigned as ⅓ again as shown in FIG. 8(b). The other re-assignment procedures are shown in FIG. 8(c) and FIG. 8(d). Clearly, this probability re-assignment method can reduce the complexity of representation. The smallest input probability is 1/17, instead of $1/(2^{32}+1)$ in this example.

The above-described embodiments of the present invention are intended to be illustrative only. Numerous alternative embodiments may be devised by those skilled in the art without departing from the scope of the following claims.

We claim:

1. A method for verifying a circuit design comprising:
providing the circuit design having a first input port and a second port and an output port;
assigning a first fractional value with a first denominator ($a_1$) to said first input port of the circuit design, said first denominator being a first integer not equal to either 2 or 1;
assigning a second fractional value with a second denominator ($a_2$) to said second input port of the circuit design, said second denominator being a second integer calculated according to $a_2=(a_1-1)^2+1$;
calculating an output value of the circuit design based on said first fractional value and said second fractional value to said output port at a Boolean gate, said calculating being in a step-by-step manner;

checking to determine if said output value of the circuit design is equal to a predetermined value; and determining a correctness of the circuit design based the checked determination of whether said output value is equal to the predetermined value.

2. The method of claim 1, said first denominator being equal to or larger than 3.

3. The method of claim 1, said first denominator being a positive integer.

4. The method of claim 1, said first fractional value and said second fractional value representing a probability of 1 or probability of 0.

5. A method for verifying an equivalence of a first circuit design and a second circuit design, each of the circuit designs having a first input port and a second input port and an output port, the method comprising:

assigning a first fractional value with a first denominator ($a_1$) to the first input ports in which said first denominator is a first integer not equal to 2 or 1;

assigning a second fractional value with second denominator ($a_2$) to the second input ports in which said second denominator is a second integer calculated according to $a_2=(a_1-1)^2+1$;

calculating an output value at each of the output ports based on said first fractional value and said second fractional value to the output ports at a Boolean gate, the calculating being in a step-by-step manner;

checking to determine if the output value of the first circuit design is equal to the output value of the second circuit design; and determining an equivalence of the first and second circuit designs based on the checked determination.

6. The method of claim 5, said first denominator being equal to or larger than 3.

7. The method of claim 5, said first denominator being a positive integer.

8. The method of claim 5, said first fractional value and said second fractional value representing a probability of 1 or a probability of 0.

9. The method of claim 5, further comprising:

obtaining an equivalent internal node of the first circuit design and the second circuit design; and reassigning a numerical value to the equivalent internal node.

* * * * *